(12) United States Patent
Kee et al.

(10) Patent No.: US 11,569,834 B2
(45) Date of Patent: Jan. 31, 2023

(54) TIME-INTERLEAVED DYNAMIC-ELEMENT MATCHING ANALOG-TO-DIGITAL CONVERTER

(71) Applicant: AyDeeKay LLC, Aliso Viejo, CA (US)

(72) Inventors: Scott David Kee, Aliso Viejo, CA (US); Setu Mohta, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/322,862

(22) Filed: May 17, 2021

(65) Prior Publication Data

US 2022/0038112 A1     Feb. 3, 2022

Related U.S. Application Data

(60) Provisional application No. 63/057,878, filed on Jul. 28, 2020.

(51) Int. Cl.
*H03M 1/12* (2006.01)

(52) U.S. Cl.
CPC ....... *H03M 1/1215* (2013.01); *H03M 1/1245* (2013.01)

(58) Field of Classification Search
CPC ................ H03M 1/1215; H03M 1/1245
USPC ................ 341/141, 159, 118, 120, 155
See application file for complete search history.

(56) References Cited

U.S. PATENT DOCUMENTS

| | | | |
|---|---|---|---|
| 7,075,471 B1 | 7/2006 | Gupta | |
| RE47,134 E | 11/2018 | Mimeault | |
| 10,386,467 B2 | 8/2019 | Dussan et al. | |
| 10,416,295 B2 | 9/2019 | Warburton | |
| 2007/0171116 A1 | 7/2007 | Fuse et al. | |
| 2012/0050082 A1* | 3/2012 | Danesh | H03M 1/1215 341/122 |
| 2012/0075129 A1 | 3/2012 | Kidambi | |
| 2015/0303934 A1* | 10/2015 | Chiu | H03M 1/1009 341/120 |
| 2015/0326240 A1* | 11/2015 | Tousi | H03M 1/183 341/118 |
| 2016/0006447 A1* | 1/2016 | Sundblad | H03M 1/1245 341/159 |

(Continued)

OTHER PUBLICATIONS

International Search Report and Written Opinion, PCT application serial No. PCT/US21/43352, dated Jan. 24, 2022.

*Primary Examiner* — Peguy Jean Pierre
(74) *Attorney, Agent, or Firm* — Steven Stupp

(57) ABSTRACT

Analog-to-digital converters (ADCs) with a high sampling rate and larger spurious-free dynamic range (SFDR) in the spectral domain are used in many applications, including, but not limited to, range finders, meteorology, spectroscopy, and/or coherent medical imaging. Circuit techniques for time-interleaving a set of low-sampling-rate sub-ADCs into a higher sampling-rate ADC with a larger SFDR than existing approaches are described. In one embodiment, the circuit techniques add a small number of additional units or sub-ADCs. This change in architecture enables a dynamic-selection procedure to time-interleave the set of sub-ADCs in such a way that mismatch-related non-idealities of the constituent sub-ADCs are spread in the frequency domain into a noise-like spectral shape in order to prevent the creation of spurious tones, which would otherwise deleteriously impact the SFDR.

20 Claims, 10 Drawing Sheets

(56) References Cited

U.S. PATENT DOCUMENTS

| | | |
|---|---|---|
| 2018/0172805 A1 | 6/2018 | Bestler et al. |
| 2018/0172831 A1 | 6/2018 | Wohlgenannt et al. |
| 2018/0267152 A1 | 9/2018 | McMichael et al. |
| 2022/0029631 A1* | 1/2022 | Sundström .......... H03M 1/1009 |

* cited by examiner

TIME-INTERLEAVED DYNAMIC-ELEMENT MATCHING ANALOG-TO-DIGITAL CONVERTER

CROSS REFERENCE TO RELATED APPLICATIONS

This application claims priority under 35 U.S.C. 119(e) to U.S. Provisional Application Ser. No. 63/057,878, entitled "Time-Interleaved Dynamic-Element Matching Analog-to-Digital Converter," by Scott David Kee, et al., filed on Jul. 28, 2020, the contents of both of which are herein incorporated by reference.

FIELD

The present disclosure relates to improving the spectral performance of an analog-to-digital converter (ADC) that interleaves the outputs of a set of lower data-rate ADCs in time, in order to achieve a higher effective sampling rate.

BACKGROUND

The non-idealities of an interleaving process arising from the inevitable mismatch between low-sampling-rate ADC units can substantially limit the spectral performance of a resulting high-sampling-rate ADC in terms of the spurious-free dynamic range (SFDR). However, for many applications, such as coherent ranging using frequency-modulated sources (e.g., LiDAR, radar or sonar), an ADC that simultaneously achieves a high-sampling rate (in order to provide long range with good range resolution) and high SFDR (in order to reduce false positive detections, while maintaining high sensitivity) is typically needed. This is because the relevant range information is encoded in the spectral domain as discrete tones whose frequency and amplitude are usually determined by downstream digital processing. Thus, conventional time-interleaved ADCs can create ghost (false-positive) objects and/or blind spots (false-negative) in the range (spectral) domain because of their limited SFDR in the presence of spurious tones in their output spectrum. Existing time-interleaving architectures produce spurious tones at frequencies that are integer multiples of the interleave rate, as well as at frequencies that arise because of the (possibly Nyquist-aliased) mixing between the input signal and these interleave-rate multiples. When examining the converted output as a spectrum, these tones cannot be easily ignored or mitigated by existing approaches because they manifest as relatively narrow spectral tones. If the data processing interprets these tones as representing real input(s), then a false detection may occur. Moreover, if the data processing ignores these tones, such as by hypothesizing that the frequency of the tone is consistent with it having come from an interleave artifact, then an actual input tone that happens to be at such a frequency may be incorrectly ignored.

Note that LiDAR is detection and ranging by illuminating an object and measuring the reflected light. A variant of this technique uses frequency-modulated light (such as light having a constantly ramping frequency), so that the frequency of the reflected signal can be used to infer the round-trip time and, therefore, the range. This technique was adapted from radar and is usually called 'frequency modulated continuous wave' (FMCW). A typical processing system may use a frequency-modulated laser for illumination. Moreover, a receiver is typically a balanced photodetector pair that is provided with the illumination laser as a local oscillator and the reflected returned light as small-signal input. The photodetector pair may then act as a mixer, so that the difference frequency is output to electronics processing. This difference frequency can vary from tens of MHz to several GHz depending on the distance to the object and the frequency ramping rate used by the laser. Furthermore, the electronics processing typically includes digitizing the signal with a high-sample-rate ADC and then applying a Fourier transform (e.g., an FFT) to detect frequencies with sufficient amplitude to interpret them a reflection from an object. Consequently, non-idealities in the electronics that manifest as narrowband spectral tones after the Fourier transform processing can be falsely interpreted as objects in the field and should be avoided.

ADCs with high sampling rates (e.g., GS/s) are typically Nyquist rate ADCs implemented using a technique called time-interleaving (TI). In this technique, each of N slower ADCs takes a turn to digitize every $N^{th}$ sample. Therefore, for a series of time samples x[k], ADC[i] would process samples x[i], x[N+i], x[2N+i], etc. Thus, the effective sampling rate of the time-interleaved ADC can be N times that of each of the individual slower sub-ADCs.

An example of simplified representation of an existing time-interleaved ADC 100 is shown in FIG. 1. In FIG. 1, an input signal 110 is provided to N sub-ADCs 114. While there is typically an input buffer 112 as depicted, in some implementations there is a direct connection to the input. Furthermore, it is not uncommon to have a separate sample and hold on the input before providing the sampled signal to the various sub-ADCs 114. Each of sub-ADCs 114 may sample (e.g., sequentially) input signal 110 at a controlled time and then may convert the sampled analog signal into a digitized representation. Although an external sample and hold is depicted in FIG. 1, this should be understood to be an indication of system intent. Many common ADC types integrate this sampling function into their internal conversion hardware, such as by loading the signal onto a sampling capacitor of a sub-ADC that is implemented as a charge-redistribution ADC. Additionally, each of the sub-ADCs 114 may have an independent logic signal that instructs it to sample and digitize the data. The merge logic (such as a multiplexer 116) assembles the output of the sub-ADCs 114 in order and presents it to the output.

Because each of the sub-ADCs 114 is only capable of digitizing a sample at a rate of 1/N of the desired output sampling rate, a controller 118 may coordinate the various sub-ADCs 114 so that they are synchronized, and so that each of the sub-ADCs 114 is activated at a sufficiently low rate that it can complete any conversion operation it is currently performing just prior to being instructed to take another sample.

FIG. 2 presents an example of a timing diagram of operation of the existing time-interleaved ADC 100 of FIG. 1. At the start of this sequence, the time-interleaved ADC 100 has not been started yet and none of the sub-ADCs 114 are busy. In this example, each of the sub-ADCs 114 receives a registered start signal that causes it to begin its operation on the subsequent sample clock. Furthermore, each of the sub-ADCs 114 may provide the digitized result of a conversion on the sample clock cycle after the conversion is complete. The controller 118 may provide each of the sub-ADCs 114 its start signal and a multiplexer select signal to route the various sub-ADC data outputs into the single high-rate output.

On cycle 1, the controller 118 provides a start signal to sub-ADC 114-1, which causes it to begin its operations during cycle 2. In this example, this conversion operation requires four clock sampling clock periods for sub-ADC 114-1, and therefore the controller 118 may ensure that it does not provide another start indication before cycle 5. On cycle 6, sub-ADC 114-1 is ready to deliver the result of this conversion/digitization and so the controller 118 may indicate to the multiplexer 116 through the select signal to route the output data D0 from sub-ADC 114-1 to the merged output during this cycle. The controller 118 can do this by knowing the latency of the sub-ADCs 114 and driving the select signal the correct number of clock cycles after the start signal has been issued. It is also possible for other multiplexing techniques to be used, such as distributed multiplexing, in which each of the sub-ADCs 114 provides a logic signal to the multiplexer 116 indicating an active level during any cycle where its output signal is valid. The multiplexer 116 can then automatically select a sub-ADC output that is accompanied by an active logic signal for that sub-ADC. In these approaches, it may only be necessary that the multiplexer 116 have the ability to synchronize the data routing to the data availability.

On cycle 2, the controller 118 cannot make use of sub-ADC 114-1 as it is currently busy. Consequently, the controller 118 provides a start signal to sub-ADC 114-2. Sub-ADC 114-2 is notionally identical to sub-ADC 114-1 and so it also requires 4 cycles to complete the operation. Therefore, it should not be issued another start strobe until cycle 6, and will provide the result of the conversion on cycle 7. Cycles 3 and 4 proceed similarly, with the controller 118 selecting sub-ADCs 114-3 and 114-4, respectively, to begin processing.

On cycle 5, all sub-ADCs 114 are currently busy, but sub-ADC 114-1 (and only sub-ADC 114-1) may be available on the next cycle. Therefore, the controller 118 can issue a start indication to sub-ADC 114-1. This causes sub-ADC 114-1 to begin processing its second sample (which is the fifth overall sample) on cycle 6. This operation requires four sample clocks, so the controller 118 may not provide a subsequent start indication before cycle 9.

For the remainder of the operation, until the time-interleaved ADC 100 stops taking new samples, the controller 118 may continue to issue the start indications in a cyclic manner, so that each of the sub-ADCs 114 is instructed to begin a conversion just as it is completing the previous one. This results in a cyclic pattern of sub-ADC use, so that each of the sub-ADCs 114 processes every $N^{th}$ sample (every fourth sample in this example).

Because the sub-ADCs 114 are not identical, the time-interleaved ADC 100 typically corrupts the data in various N-periodic ways. For example, if the conversion gain of the sub-ADCs 114 is different, then this results in an impairment equivalent to multiplying the input signal 110 with an N-periodic signal. Moreover, if the input-referred offsets of the sub-ADCs 114 are not the same, then there is the same effect as if there is an N-periodic additive input to the time-inter-leaved ADC 100. Other ADC mismatches, such as sampling-time mismatch and input-bandwidth mismatch can produce similar N-periodic effects. For a high-resolution ADC, calibration techniques are typically used to reduce these effects.

Note that a technique commonly used in oversampled data converters, such as delta-sigma converters, is dynamic element matching (DEM). In this approach, the mismatch is randomized over time, e.g., a scrambling pattern that pushes the mismatch 'noise' into a frequency that is filtered out during the decimation process.

When using time-interleaved ADC for coherent ranging applications such as LiDAR, the N-periodic non-idealities manifest as 'extra' tones in the spectrum that can be falsely perceived as objects in the field, or that result in actual objects being ignored. These false tones may be at frequencies fs/N and (frx±fs/N), where fs is the sampling rate and frx is a frequency of a legitimate input tone. As is usual in sampled systems, if the result of this equation results in the frequency being below zero or above the Nyquist rate, the frequency will be Nyquist aliased. Calibration to reduce this effect is usually not effective at reducing the amplitude of these false tones to a sufficiently small amplitude that they cannot be falsely interpreted as objects. Heuristic techniques may be used to 'guess' that a tone is at a frequency that is likely to have been generated by one of the non-idealities. However, if there were an actual tone at this frequency, the heuristic would falsely discard this tone and not 'see' an object that is actually in the field of view, but that is at an unlucky position so that it is covered by or at the same frequency as one of the interleave artifact tones.

SUMMARY

The disclosed circuit techniques avoid the generation of (self/device inflicted) spurious tones by provisioning a slightly larger than N number of unit or sub-ADCs (e.g., N+2) and using a dynamic procedure by which these sub-ADCs are selected for use that randomizes or otherwise spectrally shapes their mismatch, thereby improving the SFDR. Therefore, the resulting higher sampling rate ADC may provide high-performance ranging with lower rates of false positives and false negatives, at minimal additional complexity and cost.

In some embodiments, an ADC is described. This ADC includes an input pad or connector that receives an input signal. Moreover, the ADC includes N+K sub-ADCs, selectively electrically coupled to the input pad or connector, that sample and convert the input signal into a digital representation, where a given sub-ADC operates at an average sampling rate of 1/(N+K) of a sampling rate of an output of the ADC, and where N and K are non-zero integers. Furthermore, the ADC includes a merge circuit, electrically coupled to the N+K sub-ADCs, that combines output samples from the N+K sub-ADCs into the output of the ADC. Additionally, the ADC includes a control circuit, electrically coupled to the N+K sub-ADCs, that provides control signals that select a sequence of the N+K sub-ADCs used to sample and convert the input signal.

Note that the selected sequence may convert spectral tones in the output from N-periodic into a more-random spectrum.

Moreover, the control logic may select the sequence based at least in part on one or more spectral tones in a predefined range of frequencies in the output. Furthermore, at a given time, the control circuit may select one of at least K+1 available sub-ADCs in the N+K sub-ADCs.

Additionally, the sequence may be selected: using dynamic element matching; and/or based at least in part on a random or a pseudo-random number.

In some embodiments, the ADC includes a routing matrix that selectively electrically couples the input signal to the N+K sub-ADCs based at least in part on the control signals. Note that the merge circuit may combine the output samples from the N+K sub-ADCs based at least in part on the control signals. Moreover, the merge circuit may combine the output samples from the N+K sub-ADCs based at least in part on a given sub-ADC in the N+K sub-ADCs that provides a given output sample at a given time.

Furthermore, the merge circuit may include a multiplexer.

Additionally, the ADC may calibrate the output samples based at least in part on calibration characteristics of the N+K sub-ADCs. Note that the calibration characteristics of the ADC may be independent of the selected sequence.

In some embodiments, the ADC may dynamically select K based at least in part on power consumption and performance of the ADC.

Moreover, the ADC may modify K based at least in part on a programmable value.

Furthermore, the input signal may correspond to an optical signal.

Additionally, the selected sequence may be at least one of: non-periodic, or spectrally shaped. In some embodiments, the selected sequence has at least one of: a uniform random distribution, a non-uniform random distribution, or pre-defined autocorrelation properties.

Note that the ADC may redistribute noise such that a spur level within a particular range of frequencies is reduced.

Moreover, at a given time, the ADC may reduce power consumption by transitioning inactive sub-ADCs in the N+K sub-ADCs into a lower power state.

Furthermore, at least two sub-ADCs in the N+K sub-ADCs may be different. For example, differences in the at least two sub-ADCs may be bounded based at least in part on a corresponding contribution to a latency of the output. Alternatively or additionally, the at least two sub-ADCs may have identical output data rates and different architectures.

In some embodiments, the sub-ADCs may have one or more architectures selected from: flash, binary successive approximation, and/or pipeline.

Another embodiment provides an integrated circuit that includes the ADC.

Another embodiment provides an electronic device that includes the ADC.

Another embodiment provides a method for performing analog-to-digital conversion. This method includes at least some of the operations performed by the ADC.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An ADC is described. This ADC includes an input pad or connector that receives an input signal. Moreover, the ADC includes N+K sub-ADCs, selectively electrically coupled to the input pad or connector, that sample and convert the input signal into a digital representation, where a given sub-ADC operates at an average sampling rate of $1/(N+K)$ of a sampling rate of an output of the ADC, and where N and K are non-zero integers. Furthermore, the ADC includes a merge circuit, electrically coupled to the N+K sub-ADCs, that combines output samples from the N+K sub-ADCs into the output of the ADC. Additionally, the ADC includes a control circuit, electrically coupled to the N+K sub-ADCs, that provides control signals that select a sequence of the N+K sub-ADCs used to sample and convert the input signal.

By dynamically selecting sub-ADCs for a larger the N number of sub-ADCs, the circuit techniques may avoid the generation of (self/device inflicted) spurious tones. For example, the sub-ADCs may be selected randomly or pseudo-randomly. Moreover, the dynamic selection may spectrally shape the mismatches among the sub-ADCs, thereby improving the SFDR of the ADC. Consequently, the ADC may provide high-performance ranging with lower rates of false positives and false negatives, at minimal additional complexity and cost. These capabilities may allow the ADC to be used in a wide variety of systems, electronic devices and applications.

Figure 3:
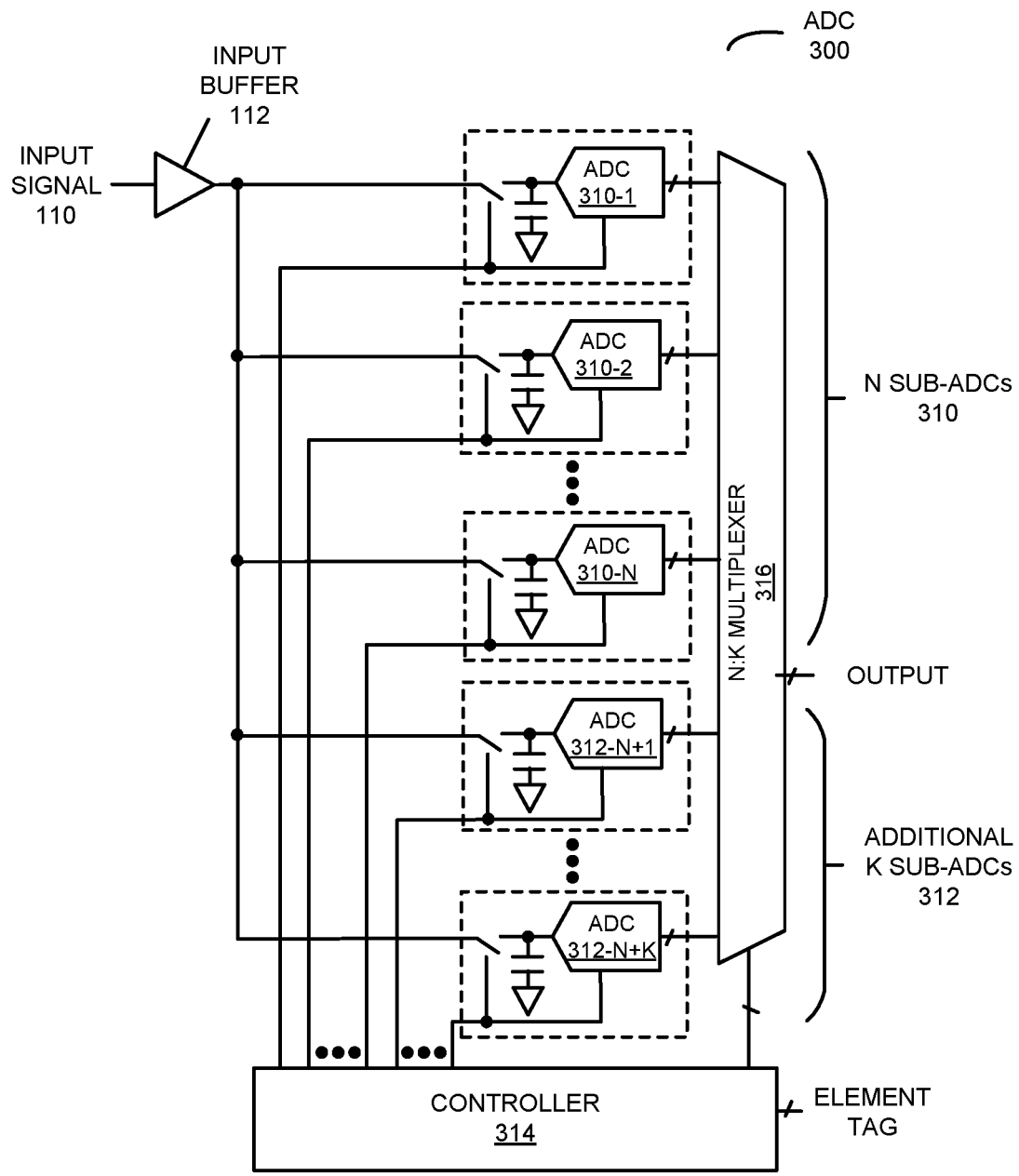
FIG. 3 is a block diagram of an example of an ADC with dynamic-element matching of sub-ADCs according to some embodiments of the present disclosure.

We now describe embodiments of the ADC. FIG. 3 presents an example of applying dynamic element matching to sub-ADCs 310 and 312 in an ADC 300, so that the spectral tones are no longer N-periodic, but have a noise-like spectrum. Notably, in FIG. 3, K additional sub-ADCs 312 are added to the original N ADCs 310. At any given sampling time, N−1 ADCs are processing samples and K+1 ADCs are available for processing the current input sample. In some embodiments, a decision technique is used to select among these candidate sub-ADCs, such that the overall sequence of sub-ADCs used is made non-periodic and (within some limits) spectrally shaped in various desirable ways. Note that, in some embodiments, this approach is used in conjunction with a calibration technique, because calibration has the added benefit of reducing the total noise power of the resulting system.

In some embodiments K equals 1, and which of the two available sub-ADCs used to process an incoming sample may be selected using uniform random sampling (such as a random sampling of two equal probabilities for the two sub-ADCs). However, in some embodiments better performance is obtained using K equal to 2, such as with LiDAR. In general, selecting randomly (or pseudo-randomly) from the K+1 available sub-ADCs may be used (as described further below with reference to FIG. 4).

One approach for implementing the decision technique is for a controller 314 in FIG. 3 to maintain a single-number reservation record for each of the sub-ADCs 310 and 312 indicating for how many sampling clock periods a given sub-ADC is unavailable.

The controller 314 in FIG. 3 provides the sampling and routing matrix at the input and the selecting and merging logic at the output of multiplexer 316. For example, the controller 314 may control which of the K+1 sub-ADCs is selected to process a given input and may provide this information to the merge logic at the output. This knowledge allows the merge logic to know which of the sub-ADCs 310 and 312 produced a given output sample. Moreover, this capability may be advantageous for calibration, because each output sample can then be calibrated specifically using the calibration characteristics of the corresponding sub-ADC that was used to generate it. In some embodiments, where background calibration is used, the components and techniques used to estimate sub-ADCs 310 and 312 mismatches can associate each sample with the physical sub-ADC being estimated. Such calibration characteristics may be known or determined using foreground and/or background calibration techniques. For example, the DC offset and gain error of each of the sub-ADCs 310 and 312 may be separately estimated during an initialization phase of the ADC 300 by injecting a known test input signal. Then, each subsequent sample can be corrected by the knowledge of which of the sub-ADCs 310 and 312 was used to generate that sample. This capability allows the calibration of the overall ADC 300 to be insensitive to the order in which the sub-ADCs 310 and 312 are selected.

Figure 4:
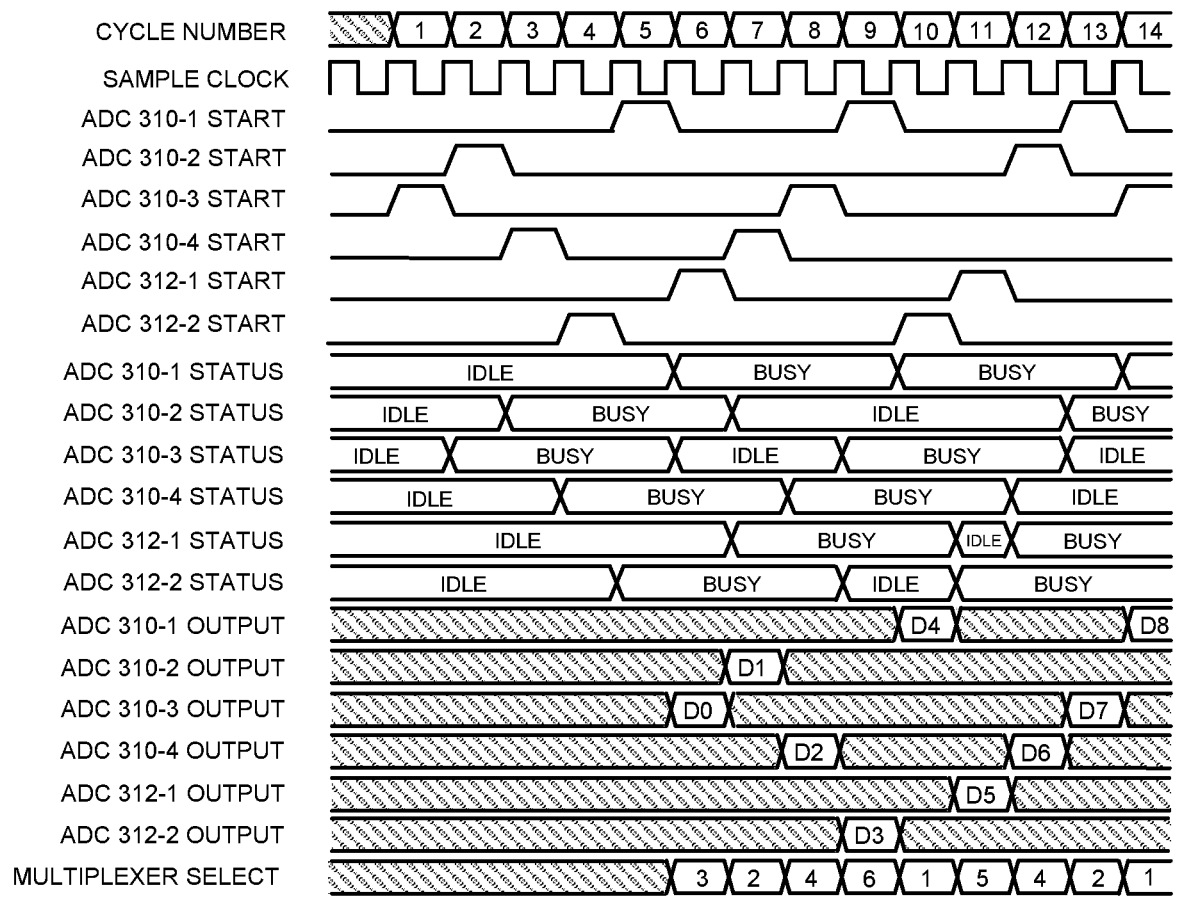
FIG. 4 is an example of a timing diagram of operation of the time-interleaved ADC of FIG. 3 according to some embodiments of the present disclosure.

FIG. 4 presents an example of a timing diagram of operation of the time-interleaved ADC 300 of FIG. 3. Notably FIG. 4 illustrates an embodiment of a random-selection technique to select among idle sub-ADCs, even during startup. Note that FIG. 4 illustrates the non-periodicity of the use of the sub-ADCs 310 and 312. On any cycle that the controller 314 indicates for a sub-ADC to begin processing, it can adjust its record for that sub-ADC to the appropriate number of cycles for that sub-ADC to complete the indicated conversion. In each sampling clock cycle, all nonzero records may be decreased by one to update for the amount of time elapsed. In order to decide which sub-ADC to assign a conversion to on any given sampling clock, the record may be examined for all sub-ADC records with zero value. When the K additional sub-ADCs are used, there will be at least K+1 such records (during startup, there can be as many as N+K). The controller 314 may generate a random or pseudo-random integer i selected over the range 0 to K, and the controller 314 may traverse the sub-ADC reservation record list until the number of zero records encountered is at least i, choosing the sub-ADC being tracked by that record. The random number can be generated with a uniform or approximately uniform distribution using a suitable technique. In some embodiments of the suitable technique, the controller 314 may generate or access a predetermined sufficiently large (e.g., 32 bits) random number using a linear feedback shift register, and then may compute the remainder of that number after division by K+1. However, other random number generating techniques for generating random integers may be used.

In some embodiments, the selection technique may be more chosen to achieve additional benefits. For example, as higher frequency input tones are typically lower in amplitude (due to round-trip path loss), in some embodiments a selection sequence that creates more 'noise' at low frequency may be used. Such a selection sequence may be considered as drawing from a non-white random distribution, and can be created by appropriate filtering of a uniform random sequence using a digital filter (such as, a low-pass filter, where the selection emphasizes more 'noise' at low frequency). Other techniques for generating pseudo-random sequences with particular shapes in the spectral domain can also be used. Moreover, pseudo-random sequences can be generated using a linear feedback shift register with an appropriate characteristic polynomial, which can then be filtered using suitable digital processing to achieve a desirable spectral shape or autocorrelation. The pseudo-random sequences can also be created using a feedback system, such as a sigma-delta modulator. In these embodiments, the feedback process may allow appropriate shaping of the frequency-domain characteristic of the generated pseudo-random sequence.

In some embodiments, the value of K and the generating technique of the selection sequence used to improve or optimize performance may be dynamically modified based at least in part on the current system requirement(s). For example, in a higher performance mode than the baseline mode, the value of K may be increased to provide a greater degree of whitening of spurs, at the expense of additional power.

The power overhead of the proposed circuit techniques may be substantially reduced by placing the set of inactive sub-ADCs into a low-power state when they are not actively processing an input sample. There will be K such inactive sub-ADCs at any given time, after the decision technique has selected one out of the 1+K available sub-ADCs. A low-power state may be implemented using clock gating and/or disabling, or power gating the inactive sub-ADCs. Moreover, a wide variety of techniques that reduce the latency in the transition between the inactive and active states to an acceptable value may be used. These approaches may mitigate the power penalty even for large values of K.

Similarly, for a constant K representing a fixed additional power and complexity overhead, the selection technique may be used to aggressively avoid spurious tones in a particular frequency range or sets of such frequencies ranges, which are of special interest at system level because of the physical distances they represent. For example, a ranging system that is included in or used in conjunction with an autonomous robot or vehicle may have a different trade-off between the probability of detection and probability of false alarms at different physical distances. A high probability of detection typically implies a higher probability of a false alarm. Nonetheless, the ranging system may have a different quantitative tradeoff between these metrics at different distances. For example, the controller 314 may prioritize the ability to see faint objects at medium distances with very high confidence (and, thus, with a low probability of a false alarm and a high probability of detection), while allowing or tolerating detecting a certain number of ghost objects (or equivalently, having blind spots) at larger distances because they are presently too far away to both immediately and seriously affect the decision-making of an autonomous robot/vehicle. In a ranging system using the disclosed circuit techniques, such a tradeoff may be implemented by biasing the selection technique to more aggressively whiten spurious tones in particular sets of frequency ranges (rather than others) for a given total complexity and additional power budget.

In some embodiments, the implementation architectures of the sub-ADCs 310 and 312 may not be identical. Instead, any of the constituent sub-ADCs 310 and 312 may only need to be upper bounded in the overall input-to-output latency, and may be identical in output data rate, but may internally be implemented with a variety of architectures (such as flash, binary successive approximation, pipeline, etc.). These different sub-ADCs may be used in the embodiments described previously.

Figure 1:
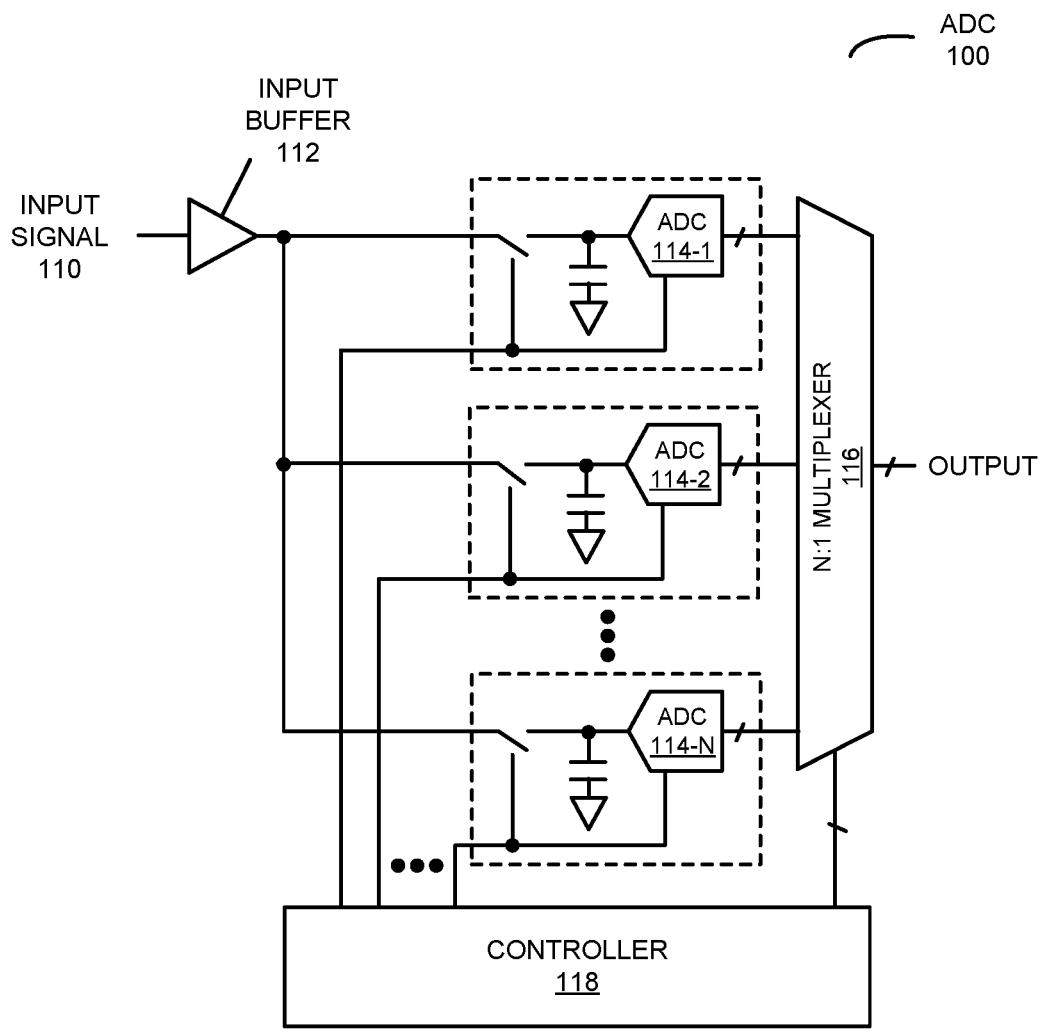
FIG. 1 is a block diagram of an existing analog-to-digital converter (ADC).
Figure 2:
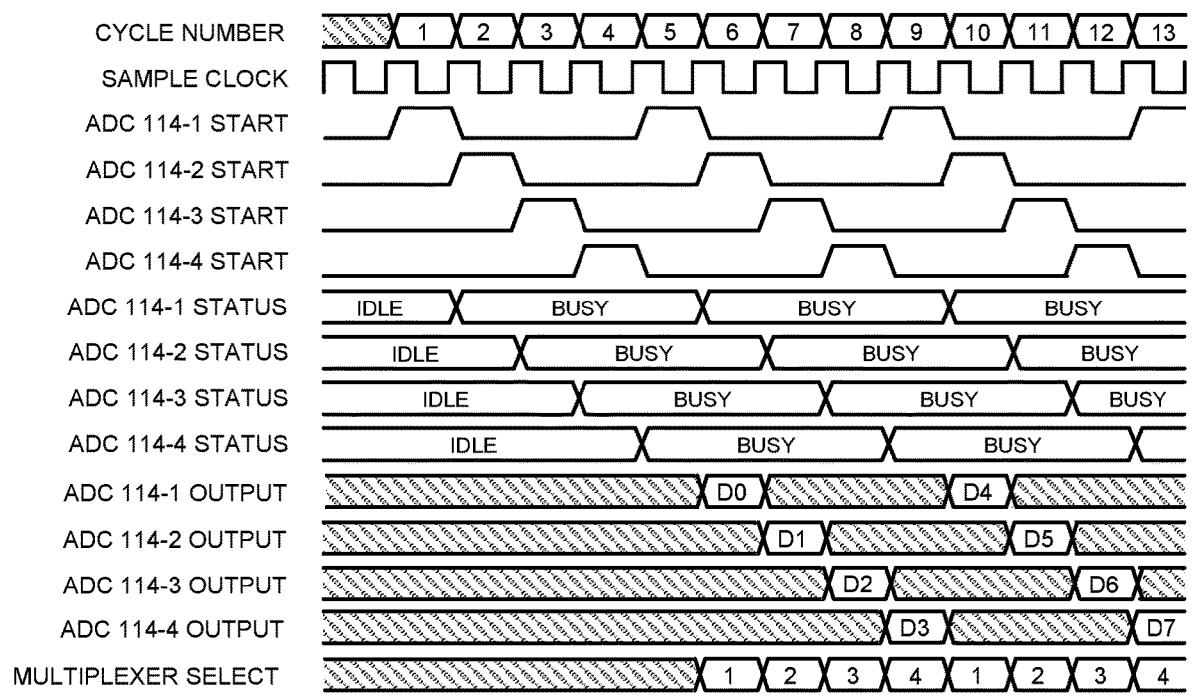
FIG. 2 is a timing diagram of operation of the existing time-interleaved ADC of FIG. 1.
Figure 5:
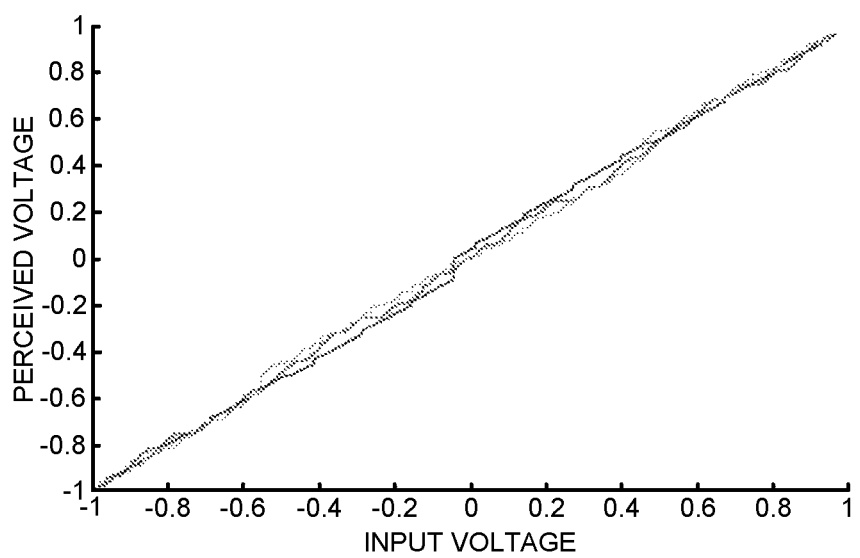
FIG. 5 is a drawing illustrating an example of mismatch-induced non-linearity in the input-output characteristic of the existing ADC of FIG. 1 with three sub-ADCs according to some embodiments of the present disclosure.

We now further describe the effect of limited linearity of constituent sub-ADCs on the ADC performance. FIG. 5 presents a drawing illustrating an example of mismatch-induced non-linearity in the input-output characteristic of the existing ADC 100 of FIG. 1 with three sub-ADCs 114. In FIG. 5, the non-linearity is enhanced for the purposes of illustration. Moreover, for purposes of illustration, the input and output are assumed to be bidirectional (signed) and centered about zero.

Figure 6A:
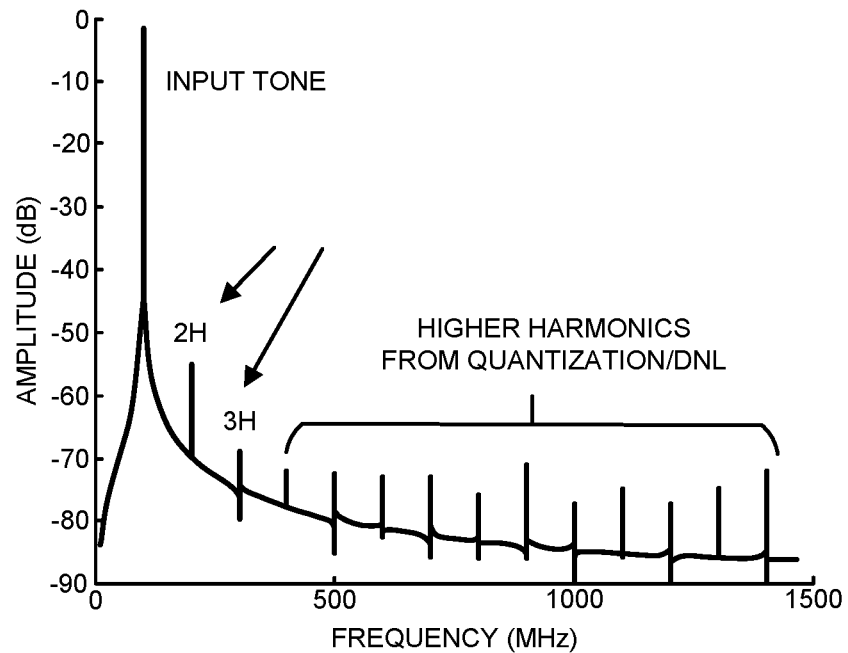
FIG. 6A is a drawing illustrating an example of an output spectrum of an ADC when a narrow-linewidth large-amplitude sinusoidal desired input signal is processed according to some embodiments of the present disclosure.

In order to aid the exposition of spectral products of a time-interleaved ADC, the spectral output from a non-ideal ADC is considered. This is shown in FIG. 6A, which presents an example of an output spectrum of an ADC when a narrow-linewidth large-amplitude sinusoidal desired input signal is processed. The spurious tones are located at harmonics of the input signal frequency. Note that the second and third harmonic levels are typically larger than the amplitudes of higher-order harmonics because the input amplitude is large. In a real ADC (or a real system that includes the ADC), the second and third harmonics may be additionally created by other sources, such as limited linearity of the pre-ADC analog signal processing. There are, in any case, a very large number of such spurious tones. Moreover, in a real ADC, Nyquist aliasing may also reposition the harmonic tones in such a way that they become indistinguishable from the tones that are already present in the input signal. For example, in a 3 GS/s ADC with a Nyquist rate of 1.5 GHz, the second harmonic of 1.3 GHz is 2.6 GHz, but this would show up at 2.6-1.5 or 1.1 GHz in the output spectrum.

Figure 6B:
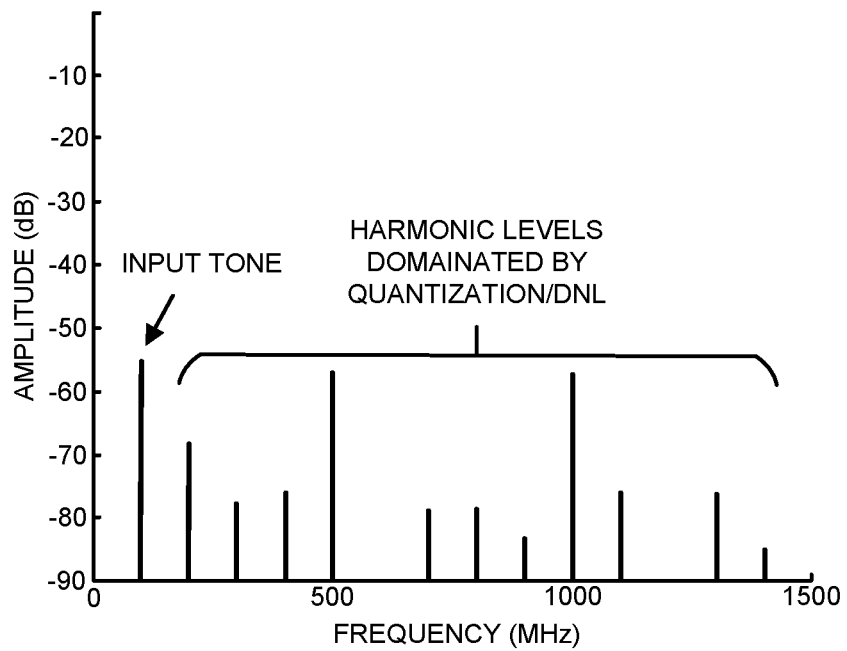
FIG. 6B is a drawing illustrating an example of an output spectrum of an ADC when a narrow-linewidth small-amplitude sinusoidal desired input signal is processed according to some embodiments of the present disclosure.

Similarly, FIG. 6B presents an example of an output spectrum of an ADC when a narrow-linewidth small-amplitude sinusoidal desired input signal is processed. In this example, the harmonic levels are dominated by quantization and limited linearity (especially differential non-linearity). Unlike FIG. 6A, it is now more difficult to identify, from the output spectrum alone, which of these spurious tones correspond to additional real objects instead of simply arising from a single desired tone, even without the additional effects of Nyquist aliasing.

Figure 7A:
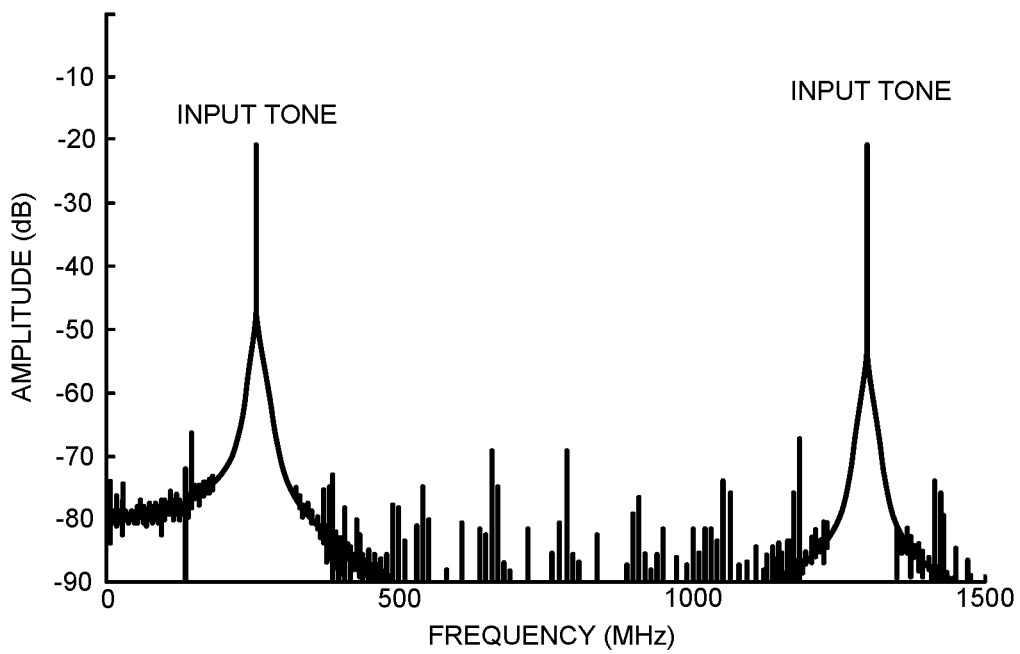
FIG. 7A is a drawing illustrating an example of an output spectrum of an ADC with limited linearity processing and an input that includes two equal amplitude tones at different frequencies according to some embodiments of the present disclosure.
Figure 7B:
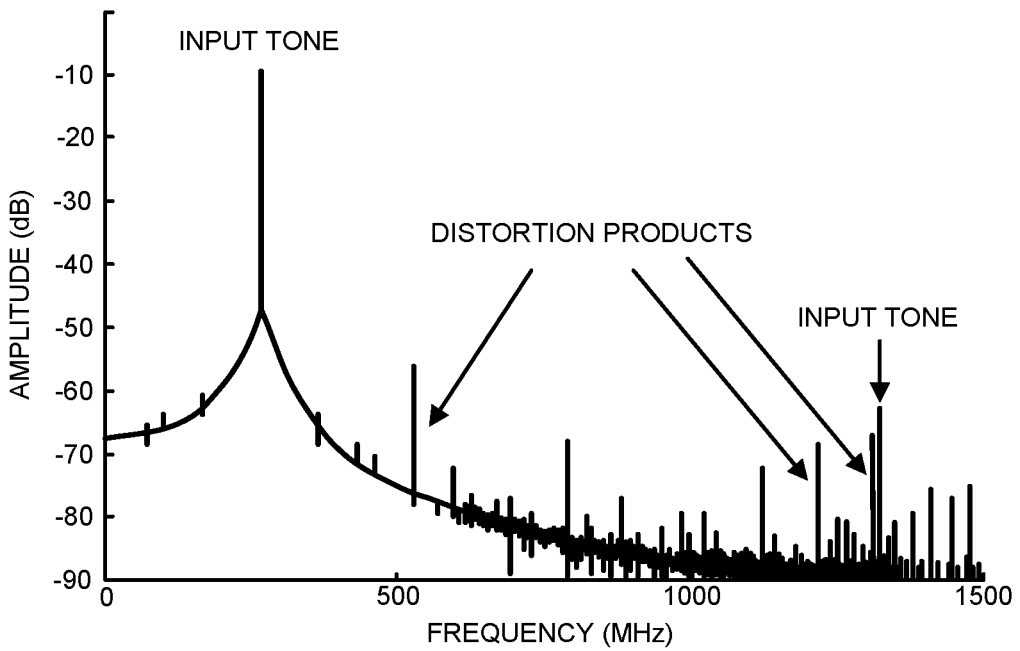
FIG. 7B is a drawing illustrating an example of an output spectrum of an ADC with limited linearity processing and an input that includes two unequal amplitude tones at different frequencies according to some embodiments of the present disclosure.

In real systems, the number of tones in the input signal may not be known a-priori. In order to motivate a practical case, consider FIG. 7A, which presents a drawing illustrating an example of an output spectrum of an ADC with limited linearity processing and an input that includes two equal amplitude tones at different frequencies. In this example, the spurious spectral products may be identified by thresholding the output spectrum to ignore all tones below a certain amplitude level. However, in coherent ranging systems, higher frequency tones corresponding to distant objects typically tend to be weaker because of higher total path loss in the signal going to and reflected back from the object. Consequently, FIG. 7B presents a drawing illustrating an example of an output spectrum of an ADC with limited linearity processing an input signal that includes two tones having unequal amplitude at different frequencies. In FIG. 7B, the distortion products arising because of mixing of these two tones through the non-linearity of the ADC are now not as easy to discard from the output spectrum alone, because they are of similar magnitude to the weaker real input signal.

Figure 8A:
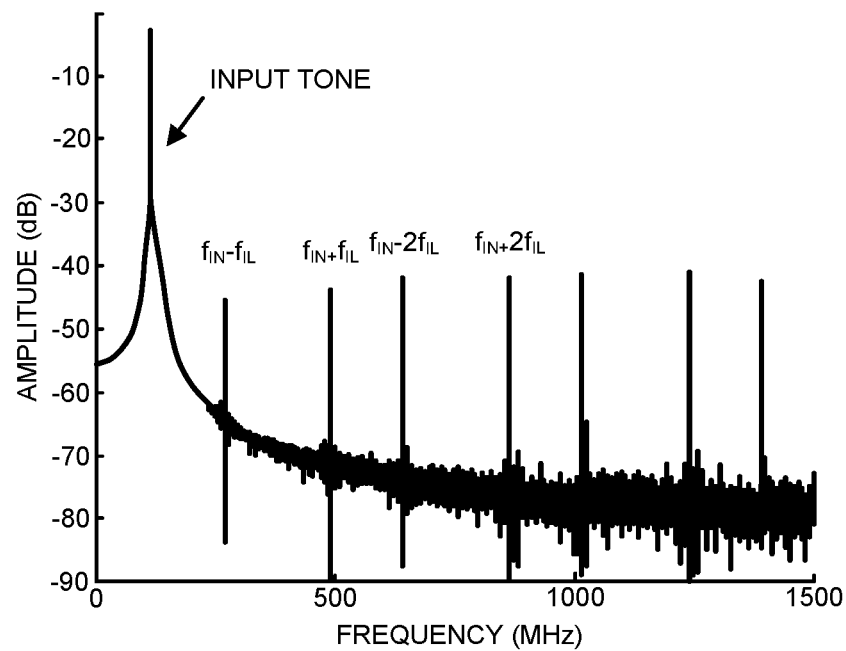
FIG. 8A is a drawing illustrating an example of an output spectrum of a time-interleaved ADC with N equal to 8 sub-ADCs that is driven with a single large-amplitude input tone, including the repositioning effect of Nyquist aliasing according to some embodiments of the present disclosure.

With above discussion as background, the case of disclosed time-interleaved ADCs is now examined. Note that the interleave frequency $f_{IL}$ may be considered effectively as an additional input signal, and thus several mixing products are generated in the output spectrum. FIG. 8A presents a drawing illustrating an example of an output spectrum of a time-interleaved ADC with N equal to 8 sub-ADCs that is driven with a single large-amplitude input tone, including the repositioning effect of Nyquist aliasing.

Whether each of the large number of tones at the output correspond to real objects, or are merely spurious tones associated with the analog-to-digital conversion process, is now particularly difficult. Even the best decision technique may be forced to consider the bins where these spurious tones lie as blind spots, i.e., the system cannot detect useful but weak signals in those bins (e.g., arising from weakly reflective objects at those physical distances).

Figure 8B:
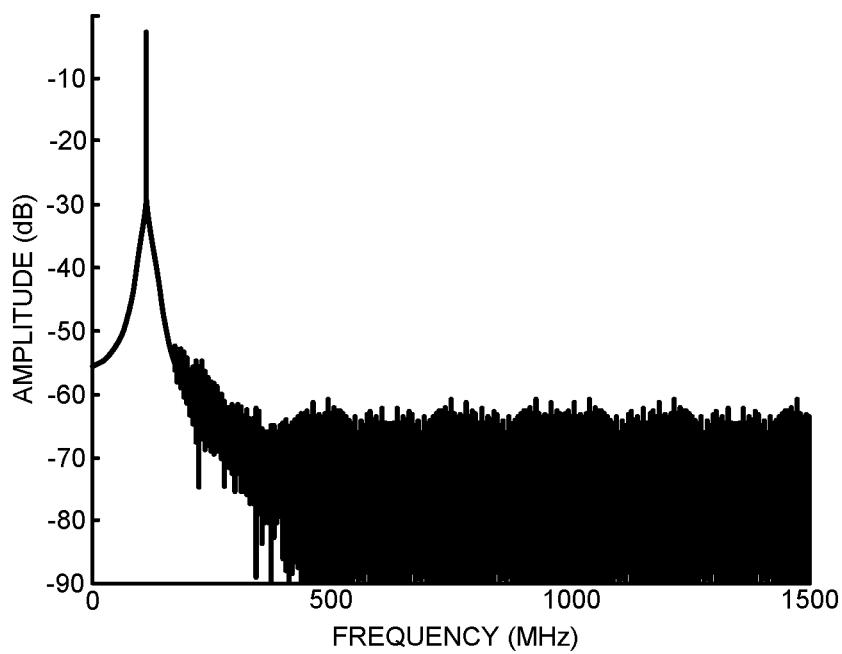
FIG. 8B is a drawing illustrating an example of an output spectrum of the time-interleaved ADC of FIG. 3 with N equal to 8 sub-ADCs, K equal to 2 additional sub-ADCs, and that is driven with a single large-amplitude input tone, including the repositioning effect of Nyquist aliasing according to some embodiments of the present disclosure.

Now, consider the ADC 300 of FIG. 3 with N equal to 8 sub-ADCs 310, but with K equal to 2 additional sub-ADCs 312, and using a selection technique that uses uniform random sampling to select which of the (K+1) equal to 3 available sub-ADCs is used to process the next input sample. This is shown in FIG. 8B, which presents a drawing illustrating an example of an output spectrum of the time-interleaved ADC 300 with N equal to 8 sub-ADCs 310, K equal to 2 additional sub-ADCs 312, and that is driven with a single large-amplitude input tone, including the repositioning effect of Nyquist aliasing. Note that the spurious tones are replaced with a noise-like spectrum with the same total output power, but whose level is much lower than any of the spurious tones shown in FIG. 8A. Moreover, the desired output signal can be identified because the SFDR of the system has been improved by 20 dB in this case (a factor of 100).

Figure 9A:
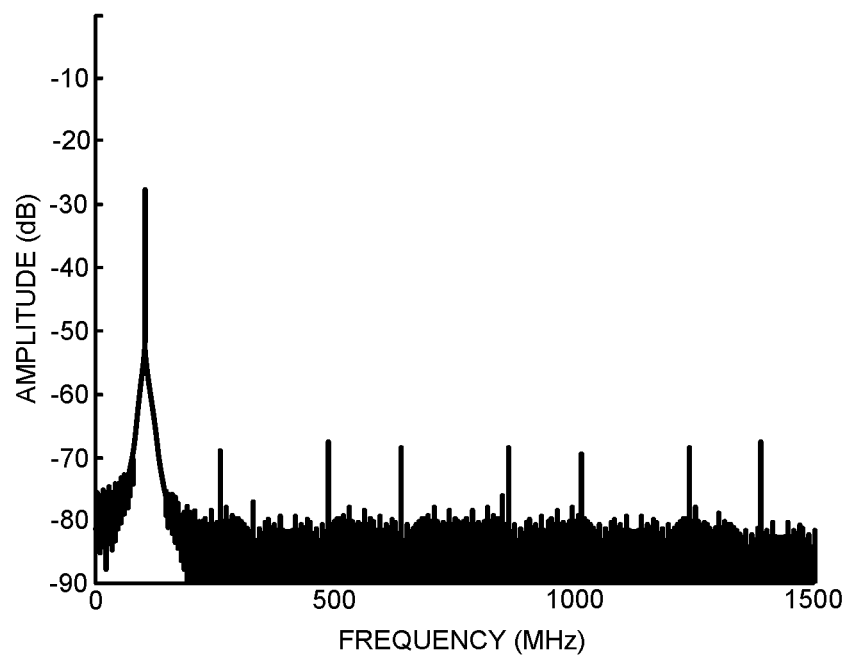
FIG. 9A is a drawing illustrating an example of an output spectrum of a time-interleaved ADC with N equal to 8 sub-ADCs that is driven with a single input tone according to some embodiments of the present disclosure.
Figure 9B:
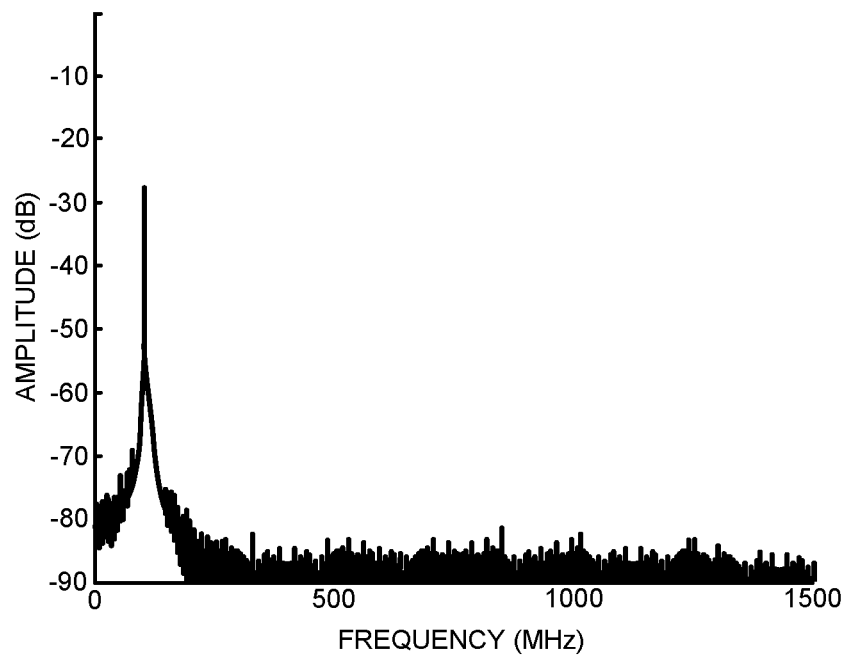
FIG. 9B is a drawing illustrating an example of an output spectrum of the time-interleaved ADC of FIG. 3 with N equal to 8 sub-ADCs, K equal to 2 additional sub-ADCs, and that is driven with the single input tone of FIG. 9A according to some embodiments of the present disclosure.

Similarly, the proposed circuit techniques improve the SFDR even if the input signal is weak. FIG. 9A presents a drawing illustrating an example of an output spectrum of a time-interleaved ADC with N equal to 8 sub-ADCs that is driven with a single input tone, which has an amplitude that is reduced relative to FIG. 8A from 0 dBc to −25 dBc. Moreover, as shown in FIG. 9B, which presents a drawing illustrating an example of an output spectrum of the time-interleaved ADC 300 with N equal to 8 sub-ADCs 310, K equal to 2 additional sub-ADCs 312, and that is driven with a single input tone that has the same amplitude as in FIG. 9A. In this example, the SFDR is improved by about 10 dB (about a factor of 10).

While the preceding embodiments illustrate ADCs with particular number and type of components (such as a number of sub-ADCs or a number of inputs), in other embodiments there may be more of fewer components, two or more components may be combined, a single component may be implemented using two or more components, and/or there may be different types of components.

Figure 10:
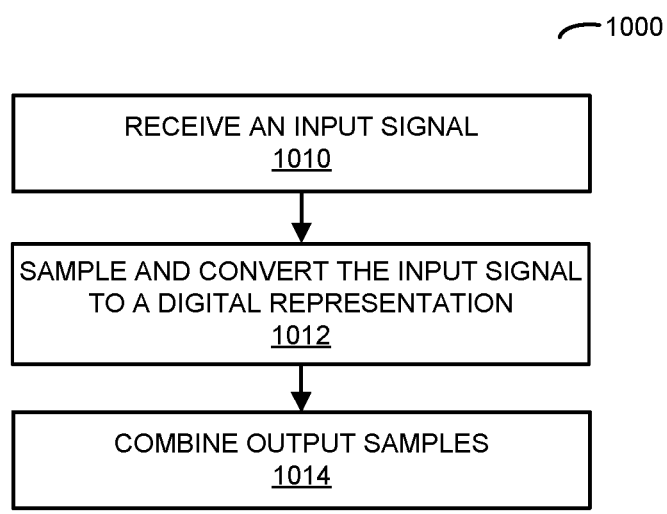
FIG. 10 is a flow diagram illustrating an example of a method for performing analog-to-digital conversion using the time-interleaved ADC of FIG. 3 according to some embodiments of the present disclosure.

We now describe embodiments of a method. FIG. 10 presents a flow diagram illustrating an example of a method 1000 for performing analog-to-digital conversion using a time-interleaved ADC, such as the time inter-leaved ADC 300 of FIG. 3. During operation, the time-interleaved ADC may receive an input signal (operation 1010). Then, the time-interleaved ADC may sample and convert the input signal into a digital representation (operation 1012) by selectively electrically coupling the input signal to N+K sub-ADCs based at least in part on a sequence of the N+K sub-ADCs. Note that a given sub-ADC operates at an average sampling rate of 1/(N+K) of a sampling rate of an output of the ADC, and N and K are non-zero positive integers. Next, the time-interleaved ADC may combine output samples (operation 1014) from the N+K sub-ADCs into the output of the ADC.

In some embodiments of the method 1000, there may be additional or fewer operations. Moreover, the order of the operations may be changed, and/or two or more operations may be combined into a single operation.

The disclosed ADCs and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the ADCs, in alternative embodiments, different components and/or subsystems may be present in the ADCs. Thus, the embodiments of the ADCs may include fewer components, additional components, different components, two or more components may be combined into a single component, a single component may be separated into two or more components, and/or one or more positions of one or more components may be changed.

Moreover, the circuits and components in the embodiments of the ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

An integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An analog-to-digital converter (ADC), comprising:
   an input pad or connector configured to receive an input signal;
   N+K sub-ADCs, selectively electrically coupled to the input pad or connector, configured to sample and convert the input signal into a digital representation, wherein a given sub-ADC operates at an average sampling rate of 1/(N+K) of a sampling rate of an output of the ADC, and wherein N and K are non-zero integers;
   a merge circuit, electrically coupled to the N+K sub-ADCs, configured to combine output samples from the N+K sub-ADCs into the output of the ADC; and
   a control circuit, electrically coupled to the N+K sub-ADCs, configured to provide control signals that select a sequence of the N+K sub-ADCs used to sample and convert the input signal, and
   wherein the ADC is configured to: modify K based at least in part on a programmable value; redistribute noise such that a spur level within a particular range of frequencies is reduced; or reduce power consumption by transitioning inactive sub-ADCs in the N+K sub-ADCs into a lower power state.

2. The ADC of claim 1, wherein the selected sequence converts spectral tones in the output from N-periodic into a more-random spectrum.

3. The ADC of claim 1, wherein the control logic is configured to select the sequence based at least in part on one or more spectral tones in a predefined range of frequencies in the output.

4. The ADC of claim 1, wherein, at a given time, the control circuit is configured to select one of at least K+1 available sub-ADCs in the N+K sub-ADCs.

5. The ADC of claim 1, wherein the ADC comprises a routing matrix that is configured to selectively electrically couple the input signal to the N+K sub-ADCs based at least in part on the control signals.

6. The ADC of claim 5, wherein the merge circuit is configured to combine the output samples from the N+K sub-ADCs based at least in part on the control signals.

7. The ADC of claim 6, wherein the merge circuit is configured to combine the output samples from the N+K sub-ADCs based at least in part on a given sub-ADC in the N+K sub-ADCs that is configured to provide a given output sample at a given time.

8. The ADC of claim 1, wherein the merge circuit comprises a multiplexer.

9. The ADC of claim 1, wherein the ADC is configured to calibrate the output samples based at least in part on calibration characteristics of the N+K sub-ADCs.

10. The ADC of claim 9, wherein the calibration characteristics of the ADC are independent of the selected sequence.

11. The ADC of claim 1, wherein the ADC is configured to dynamically select K based at least in part on power consumption and performance of the ADC.

12. The ADC of claim 1, wherein the input signal corresponds to an optical signal.

13. The ADC of claim 1, wherein the sequence is selected: based at least in part on a random or a pseudo-random number; or using dynamic element matching.

14. The ADC of claim 1, wherein the selected sequence is at least one of:
   non-periodic, or spectrally shapes mismatches associated with the N+K sub-ADCs among the N+K sub-ADCs.

15. The ADC of claim 1, wherein the selected sequence has at least one of: a uniform random distribution, a non-uniform random distribution, or predefined autocorrelation properties.

16. The ADC of claim 1, wherein at least two sub-ADCs in the N+K sub-ADCs are different.

17. The ADC of claim 16, wherein: differences in the at least two sub-ADCs are bounded based at least in part on a corresponding contribution to a latency of the output; or the at least two sub-ADCs have identical output data rates and different architectures.

18. An electronic device, comprising:
   an analog-to-digital converter (ADC), comprising:
      an input pad or connector configured to receive an input signal;
      N+K sub-ADCs, selectively electrically coupled to the input pad or connector, configured to sample and convert the input signal into a digital representation, wherein a given sub-ADC operates at an average sampling rate of 1/(N+K) of a sampling rate of an output of the ADC, and wherein N and K are non-zero integers;
      a merge circuit, electrically coupled to the N+K sub-ADCs, configured to combine output samples from the N+K sub-ADCs into the output of the ADC; and
      a control circuit, electrically coupled to the N+K sub-ADCs, configured to provide control signals that select a sequence of the N+K sub-ADCs used to sample and convert the input signal, and
      wherein the ADC is configured to: modify K based at least in part on a programmable value; redistribute noise such that a spur level within a particular range of frequencies is reduced; or reduce power consumption by transitioning inactive sub-ADCs in the N+K sub-ADCs into a lower power state.

19. A method for performing analog-to-digital conversion, comprising:
   by an analog-to-digital converter (ADC):
   receiving an input signal;
   sampling and converting the input signal into a digital representation by selectively electrically coupling the input signal to N+K sub-ADCs based at least in part on a sequence of the N+K sub-ADCs, wherein a given sub-ADC operates at an average sampling rate of 1/(N+K) of a sampling rate of an output of the ADC, and wherein N and K are non-zero positive integers;
   combining output samples from the N+K sub-ADCs into the output of the ADC, and wherein the method comprises at least one of:
   modifying K based at least in part on a programmable value;
   redistributing noise such that a spur level within a particular range of frequencies is reduced; or
   reducing power consumption by transitioning inactive sub-ADCs in the N+K sub-ADCs into a lower power state.

20. The electronic device of claim 18, wherein at least two sub-ADCs in the N+K sub-ADCs are different.

* * * * *